United States Patent
McLaren

(10) Patent No.: US 10,862,434 B1
(45) Date of Patent: Dec. 8, 2020

(54) ASYMMETRIC DOHERTY AMPLIFIER WITH COMPLEX COMBINING LOAD MATCHING CIRCUIT

(71) Applicant: NXP USA, Inc., Austin, TX (US)

(72) Inventor: Roy McLaren, Gilbert, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 16/667,151

(22) Filed: Oct. 29, 2019

(51) Int. Cl.
- H03F 1/02 (2006.01)
- H03F 3/21 (2006.01)
- H03K 5/01 (2006.01)
- H03F 1/56 (2006.01)
- H03F 1/32 (2006.01)
- H03K 5/00 (2006.01)

(52) U.S. Cl.
CPC ............ H03F 1/0288 (2013.01); H03F 1/32 (2013.01); H03F 1/565 (2013.01); H03F 3/211 (2013.01); H03K 5/01 (2013.01); *H03F 2200/387* (2013.01); *H03F 2200/451* (2013.01); *H03K 2005/00286* (2013.01)

(58) Field of Classification Search
CPC .................................................. H03F 1/0288
See application file for complete search history.

(56) References Cited

U.S. PATENT DOCUMENTS

| | | | |
|---|---|---|---|
| 9,614,479 | B2 | 4/2017 | Hallberg et al. |
| 10,033,335 | B1* | 7/2018 | Chan ...................... H03F 3/195 |
| 2009/0167438 | A1* | 7/2009 | Yang ........................ H03F 3/604 330/295 |
| 2012/0126891 | A1 | 5/2012 | Kim et al. |
| 2014/0320214 | A1* | 10/2014 | Liu ......................... H03F 1/0288 330/295 |

(Continued)

OTHER PUBLICATIONS

Fang, Xiaohu et al; "Broadband, Wide Efficiency Range, Doherty Amplifier Design Using Frequency-Varying Complex Combining Load"; IEEE MTT-S International Microwave Symposium; IEEE Explore; 4 pages (Jul. 27, 2015).

(Continued)

*Primary Examiner* — Patricia T Nguyen
(74) *Attorney, Agent, or Firm* — Sherry W. Schumm

(57) ABSTRACT

A Doherty power amplifier includes input circuitry that provides input signals to asymmetric carrier and peaking amplifiers (e.g., a peaking-to-carrier size ratio, α is greater than 1.15) with an absolute value of an input phase offset between 15 degrees and 165 degrees or between 195 degrees and 345 degrees. Carrier and peaking amplifier output signals are combined at a combining node. A complex combining load matching circuit, which is connected to the combining node, provides a complex impedance, $Z_L$, with a non-zero reactive portion, $x_n$. The output circuit between the peaking amplifier and the combining node has an electrical length of 0 or n*180 degrees (n=an integer value). The output circuit between the carrier amplifier and the combining node has an electrical length, θx, where a difference between the electrical lengths of the peaking output circuit and the carrier output circuit is equal to the input phase offset.

19 Claims, 4 Drawing Sheets

(56) References Cited

U.S. PATENT DOCUMENTS

| | | | | |
|---|---|---|---|---|
| 2015/0188504 A1* | 7/2015 | Kesson | ............... | H03F 1/56 |
| | | | | 330/286 |
| 2016/0268976 A1* | 9/2016 | Negra | ............... | H03F 1/0211 |
| 2018/0331172 A1 | 11/2018 | Schultz et al. | | |
| 2019/0074799 A1* | 3/2019 | Ai | ............... | H03F 3/21 |
| 2019/0312552 A1 | 10/2019 | Chan et al. | | |

OTHER PUBLICATIONS

Fang, Xiao-Hu et al; "Two-Way Doherty Power Amplifier Efficiency Enhancement by Incorporating Transistors' Nonlinear Phase Distortion"; IEEE Microwave and Wireless Components Letters, vol. 28, No. 2; 3 pages (Feb. 2018).

Ozen, Mustafa et al; "Symmetrical Doherty Amplifier with High Efficiency over Large Output Power Dynamic Range"; IEEE MTT-S International Microwave Symposium; IEEE Explore; 4 pages (Jul. 10, 2014).

Ozen, Mustafa et al; "Symmetrical Doherty Power Amplifier With Extended Efficiency Range"; IEEE Transactions on Microwave Theory and Techniques, vol. 64, No. 4; 12 pages (Apr. 2016).

Notice of Allowance; U.S. Appl. No. 16/667,113; 8 pages (Oct. 7, 2020).

* cited by examiner

ASYMMETRIC DOHERTY AMPLIFIER WITH COMPLEX COMBINING LOAD MATCHING CIRCUIT

TECHNICAL FIELD

Embodiments of the subject matter described herein relate generally to Doherty power amplifiers.

BACKGROUND

For many years, the Doherty power amplifier has been one of the most popular amplifiers for cellular infrastructure applications. A two-way Doherty amplifier includes a carrier amplifier and a peaking amplifier, which are connected in parallel between an amplifier input and an amplifier output. During operation, an input radio frequency (RF) signal is divided into carrier and peaking signals, and a phase difference of 90 degrees is applied between the carrier and peaking signals prior to amplification by the carrier and peaking amplifiers. On the output side, the amplified carrier and peaking signals are then phase-aligned before the amplified signals are combined together by a signal combiner.

A Doherty amplifier may have a symmetric or an asymmetric configuration, where each configuration type has its advantages and disadvantages. In a symmetric Doherty amplifier, the carrier and peaking amplifiers have substantially the same current-carrying capability, which may be achieved by utilizing carrier and peaking power amplifiers of the same transistor size (or periphery). Conversely, in an asymmetric Doherty amplifier, the peaking amplifier typically has a significantly greater current-carrying capacity than the carrier amplifier. This may be achieved by utilizing a significantly larger sized peaking power amplifier than the carrier power amplifier.

In comparison with asymmetric Doherty amplifiers, conventional symmetric Doherty amplifiers tend to have better gain, RF bandwidth, and linearity (i.e., the AM-AM/AM-PM behavior is favorable for linearization). However, the load modulation for a symmetric Doherty amplifier is limited only to 2 (i.e., the variable standing wave ratio (VSWR) is about 2:1).

Accordingly, the efficiency boost obtained for a modulated load in the back-off Doherty condition tends to be better for a conventional symmetric Doherty amplifier than it is for a class-AB power amplifier. However, the efficiency boost for a conventional symmetric Doherty amplifier is significantly poorer than for a conventional asymmetric Doherty amplifier. In contrast, because an asymmetric Doherty amplifier has a load modulation greater than 2 (i.e., VSWR>2:1), asymmetric Doherty amplifiers tend to have better back-off efficiency than both class-AB and conventional symmetric Doherty amplifiers. However, due to their nonlinear AM-AM/AM-PM behavior and the need for an uneven input RF signal split ratio, asymmetric Doherty amplifiers also are characterized by relatively lower back-off gain and poorer linearity, when compared with conventional symmetric Doherty amplifiers.

Amplifier designers strive to develop Doherty amplifier designs that achieve the advantages of both symmetric and asymmetric configurations, while avoiding the various disadvantages of the two configuration types. What is desired is a relatively simple Doherty amplifier design with reduced parasitic effects, relatively-simple impedance matching circuitry, relatively-high gain, and linearizable power added efficiency.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of the inventive subject matter include Doherty amplifier architectures that utilize asymmetric carrier and peaking power amplifier devices coupled to (or terminated with) a complex combining load (CCL) matching circuit. Such amplifier embodiments, which may be referred to herein as "asymmetric CCL Doherty amplifiers," are enabled with a complete, closed-form mathematical solution set which is described in detail below. In comparison with conventional, asymmetric Doherty power amplifiers terminated with a real load, the asymmetric CCL Doherty amplifier embodiments described herein may have the advantages of an increased power added efficiency, especially at higher output power back-off levels. In addition, embodiments of asymmetric CCL Doherty amplifiers include an input splitter, which provides optimal input RF signal amplitude and phasing relationships for the asymmetric CCL Doherty amplifiers.

As used herein, the term "size", when referring to a physical characteristic of a power amplifier or power transistor, refers to the periphery or the current carrying capacity of the transistor(s) associated with that amplifier or transistor. The term "symmetric", when referring to the relative sizes of carrier and peaking amplifiers, means that the size of the power transistor(s) forming the carrier amplifier is/are substantially identical to (i.e., within 5%) the size of the power transistor(s) forming the peaking amplifier. Conversely, the term "asymmetric," without any other qualifiers, means that the size of the power transistor(s) forming the peaking amplifier is/are 15% or more than the size of the power transistor(s) forming the carrier amplifier. "Highly-asymmetric," as used herein, means that the size of the power transistor(s) forming the peaking amplifier is/are 100% or more than the size of the power transistor(s) forming the carrier amplifier. Accordingly, for example, when the peaking-to-carrier size (or periphery) ratio, α, is denoted as x/y (where x corresponds to relative peaking amplifier size and y corresponds to relative carrier amplifier size), a ratio of 1.0 (or 1/1) would be symmetric, a ratio greater than or equal to 1.15 would be asymmetric, and a ratio greater than or equal to 2.0 would be highly asymmetric, according to the above definitions. Further, as used herein, the term "shunt" means electrically coupled between a circuit node and a ground reference (or other DC voltage reference).

Figure 1:
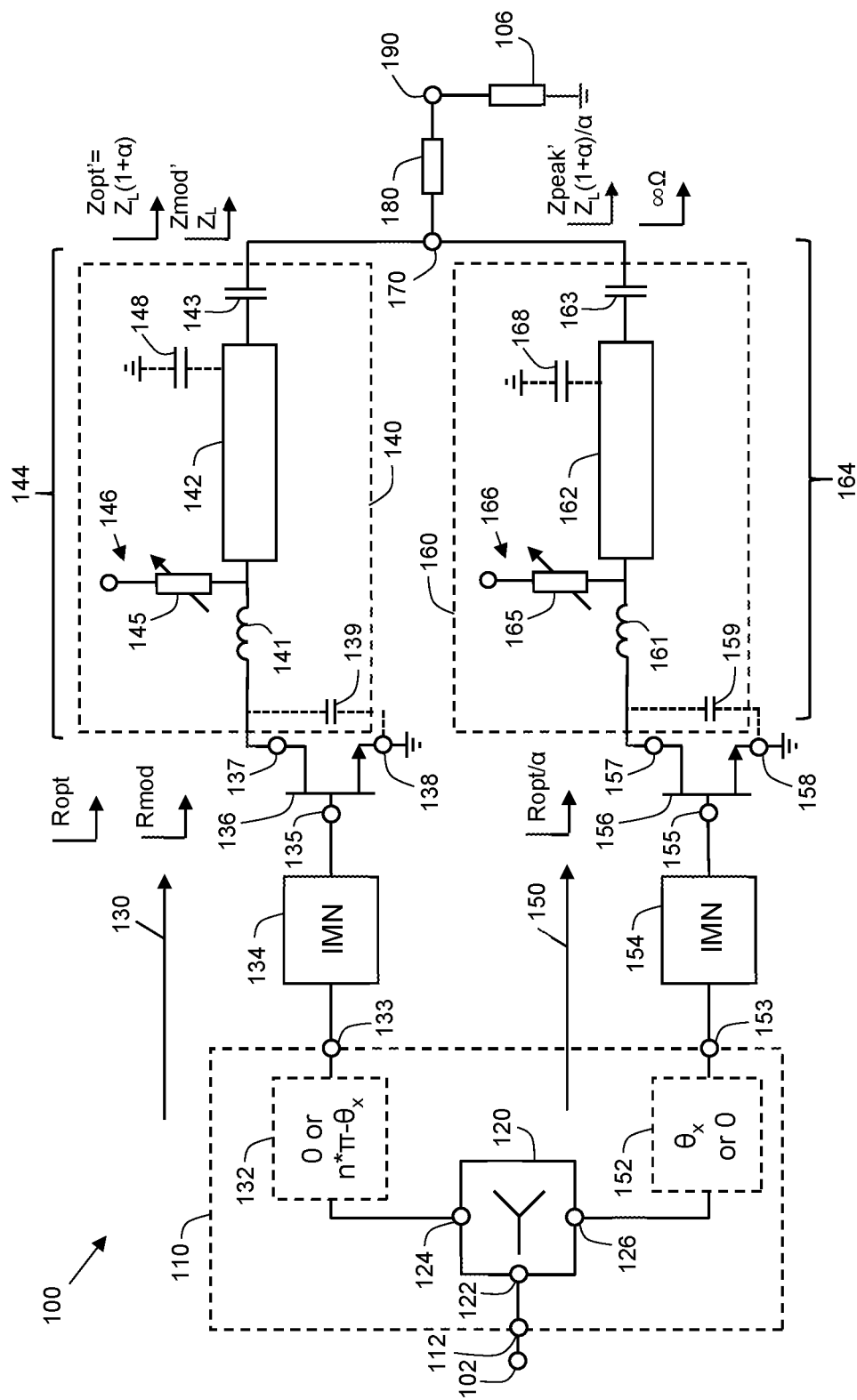
FIG. 1 is a schematic representation of an asymmetric Doherty power amplifier, in accordance with an example embodiment.

FIG. 1 illustrates a simplified schematic of a two-way asymmetric CCL Doherty power amplifier 100, according to an embodiment. Asymmetric CCL Doherty amplifier 100 includes an RF input 102, an RF output 190, input circuitry 110, a carrier amplification path 130, a peaking amplification path 150, and a combining node 170. An antenna 106 (or another type of load) is coupled to the combining node 170 through a complex combining load (CCL) matching circuit 180 and the RF output 190. According to an embodiment of the inventive subject matter, the CCL matching circuit 180 is an impedance transformer (or matching network), which transforms the impedance at node 190 to the impedance at combining node 170, as will be described in more detail later.

Asymmetric CCL Doherty power amplifier 100 is considered to be a "two-way" Doherty power amplifier, which includes one carrier amplification path 130 and one peaking amplification path 150. Essentially, the carrier amplifier 136 provides RF signal amplification along the carrier amplification path 130, and the peaking amplifier 156 provides RF signal amplification along the peaking amplification path 150. The amplified carrier and peaking RF signals are then combined at combining node 170 before provision to the CCL matching circuit 180 and RF output 190.

The input circuitry 110 has an input 112 coupled to the RF input 102, and two outputs, where each output is coupled to either a carrier path input 133 or a peaking path input 153, which in turn are coupled to the carrier and peaking amplification paths 130, 150, respectively. The input circuitry 110 is configured to receive, at input 112, an input RF signal from RF input 102, and to divide the power of the input RF signal into a carrier input RF signal and a peaking input RF signal. The input circuitry 110 is further configured to provide, at carrier path input 133, the carrier input RF signal to the carrier amplification path 130, and to provide, at peaking path input 153, the peaking input RF signal to the peaking amplification path 150. According to an embodiment, the input circuitry 110 is configured to produce the carrier and peaking input RF signals with a desired phase difference (referred to as an "input phase offset") between the carrier and peaking input RF signals.

In some embodiments, the input circuitry 110 includes a digital signal processor configured to produce and provide the carrier and peaking input RF signals with the desired input phase offset. In other embodiments, and as illustrated in FIG. 1, the input circuitry 110 includes a power splitter 120 and one or more input phase shift elements 132, 152 (e.g., input offset lines) configured to produce and provide the carrier and peaking input RF signals with the desired input phase offset. The power splitter 120 has an input 122 coupled to the input circuitry input 112 and to the RF input 102, and carrier and peaking outputs 124, 126 coupled to the carrier and peaking amplification paths 130, 150, respectively. Essentially, power splitter 120 is configured to divide the power of the input RF signal received at power splitter input 122 (through RF input 102 and input circuitry input 112) into carrier and peaking portions of the input signal (i.e., the carrier input RF signal and the peaking input RF signal). The carrier input RF signal is provided to the carrier amplification path 130 at power splitter output 124, and the peaking input RF signal is provided to the peaking amplification path 150 at power splitter output 126. During operation in a relatively low-power mode, only the carrier amplifier 136 is supplying current to the CCL matching circuit 180 and antenna 106, and the power splitter 120 provides the input signal power only to the carrier amplification path 130. Conversely, during operation in a relatively high-power mode, both the carrier and peaking amplifiers 136, 156 supply current to the CCL matching circuit 180 and antenna 106, and the power splitter 120 divides the input signal power between the amplification paths 130, 150.

Power splitter 120 may have any of a variety of configurations, including Wilkinson-type splitters, hybrid quadrature splitters, and so on. Power splitter 120 divides the power of the input RF signal according to the peaking-to-carrier size (or periphery) ratio, α. For example, when Doherty amplifier 100 has an asymmetric or highly-asymmetric Doherty amplifier configuration in which the carrier amplifier 136 and the peaking amplifier 156 are of substantially different sizes (i.e., the Doherty amplifier 100 has a 1.15 to 2.0 peaking-to-carrier size ratio), the power splitter 120 may divide the power such that less of the input signal power is provided to the carrier amplification path 130, and more of the input signal power is provided to the peaking amplification path 150. More specifically, when α=x/y (where x corresponds to relative peaking amplifier size and y corresponds to relative carrier amplifier size), the power splitter 120 would divide the power such that y/(x+y) of the input signal power is provided to the carrier amplification path 130, and x/(x+y) of the input signal power is provided to the peaking amplification path 150. As a more specific example, when the peaking-to-carrier size ratio is 2.0, the power splitter 120 may divide the power such that ⅓ of the input signal power is provided to the carrier amplification path 130, and ⅔ of the input signal power is provided to the peaking amplification path 150.

In asymmetric CCL Doherty amplifier 100, the input circuitry 110 is configured so that the input signal supplied to the peaking amplification path 150 is delayed by an input phase offset with respect to the input signal supplied to the carrier amplification path 130 or that the input signal supplied to the carrier amplification path 130 is delayed by an input phase offset with respect to the input signal supplied to the peaking amplification path 150 at the center frequency of operation, fo, of the amplifier 100. When included, the carrier and/or peaking input phase shifters 132, 152 are configured to impart the desired input phase offset between the carrier and peaking input RF signals.

To ensure proper operation of the Doherty amplifier 100, and as will be described in detail below, the magnitude of the input phase offset is determined based on the electrical lengths 144, 164 of the carrier and peaking output circuits 140, 160. In other words, the values of the phase shifts imparted by phase shifters 132, 152 (which determine the input phase offset) depend on the electrical lengths 144, 164 of the carrier and peaking output circuits 140, 160, in an embodiment. The electrical length 144 of the carrier output circuit 140 is a non-zero value referred to herein as theta x ($\theta_x$). Essentially, the electrical length 144, $\theta_x$, corresponds to the phase shift imparted on the carrier output RF signal between the output 137 of the carrier amplifier 136 and the combining node 170 (i.e., the insertion phase length for the carrier amplifier output matching circuit). As will be explained in detail later, the electrical length 144, $\theta_x$, is a value that is mathematically derived from the complex load presented at combining node 170. In other words, the structure of the CCL matching circuit 180 determines the value of the electrical length 144. Conversely, the electrical length 164 of the peaking output circuit 160 may equal about 0 degrees or about n*π (i.e., n*180 degrees), where n=an integer value (e.g., 1, 2, 3, . . . ), in various embodiments, and "*" is a multiplication operation. As will be explained in more detail below, the phasing relationship of the carrier and peaking output circuits 140, 160 on the output-side of the amplifiers 136, 156 determines the phasing applied to the carrier and peaking input RF signals on the input-side of the amplifiers 136, 156.

As a governing rule, the electrical length of the carrier amplification path 130 (i.e., a sum of the phase shift applied by phase shifter 132, the insertion phase of IIN 134, the insertion phase of amplification device 136, and the electrical length 144 ($\theta_x$) of the carrier output circuit 140, including parasitic capacitance 139) should equal the electrical length of the peaking amplification path 150 (i.e., a sum of the phase shift applied by phase shifter 152, the insertion phase of IMN 154, the insertion phase of amplification device 156, and the electrical length 164 of the peaking output circuit 160, including parasitic capacitance 159 (0 or n*180 degrees)) to ensure that the signals amplified along the carrier and peaking amplification paths 130, 150 combine coherently (in phase) at combining node 170. This rule indicates that at least two combinations of different phase shifts may be implemented with phase shifters 132, 152, while still ensuring coherency of the amplified carrier and peaking RF signals at combining node 170:

1) PS 132 (phase shift imparted by phase shifter 132)=0;
   PS 152 (phase shift imparted by phase shifter 152)=$\theta_x$;
   EL 144 (electrical length 144 of carrier output circuit 140)=$\theta_x$; and
   EL 164 (electrical length 164 of peaking output circuit 160)=0 degrees.

When the electrical length 164 of the peaking output circuit 160 is about 0 degrees, phase shifter 132 may be excluded, as it otherwise would be configured to avoid imparting a phase shift on the carrier input RF signal (or to impart 0 degrees of phase shift), and phase shifter 152 is configured to impart a phase shift of $\theta_x$, on the peaking input RF signal. In this example embodiment, the sum of the phase shift applied by phase shifter 132 (0 degrees, in this example) plus the electrical length 144 ($\theta_x$) of the carrier output circuit 140 equals $\theta_x$ degrees, and the sum of the phase shift applied by phase shifter 152 ($\theta_x$, in this example) plus the electrical length 164 (0 degrees, in this example) are equal to each other. The magnitude of the input phase offset is $\theta_x$ degrees, and both sums are equal to $\theta_x$ degrees.

2) PS 132 (phase shift imparted by phase shifter 132)= n*180 degrees–$\theta_x$;
   PS 152 (phase shift imparted by phase shifter 152)=0;
   EL 144 (electrical length 144 of carrier output circuit 140)=$\theta_x$; and
   EL 164 (electrical length 164 of peaking output circuit 160)=n*180 degrees.

When the electrical length 164 of the peaking output circuit 160 is about n*180 degrees, phase shifter 152 may be excluded, as it otherwise would be configured to avoid imparting a phase shift on the peaking input RF signal (or to impart 0 degrees of phase shift), and phase shifter 132 is configured to impart a phase shift of n*180 degrees–$\theta_x$ on the carrier input RF signal. In this example embodiment, the sum of the phase shift applied by phase shifter 132 (n*180 degrees–$\theta_x$, in this example) plus the electrical length 144 ($r$) of the carrier output circuit 140 equals n*180 degrees, and the sum of the phase shift applied by phase shifter 152 (0, in this example) plus the electrical length 164 (n*180 degrees, in this example) are equal to each other. The input phase offset is n*180 degrees–$\theta_x$ degrees, and both sums are equal to n*180 degrees.

The above combinations assume that the IMNs 134, 154 each impart the same insertion phase, and that the amplification devices 136, 156 also each impart the same insertion phase. In practice, the IMNs 134, 154 may impart different insertion phases and/or the amplification devices 136, 156 may impart different insertion phases. In a practical design, and as would be understood by those of skill in the art based on the description herein, when either or both the IMNs 134, 154 and/or the amplification devices 136, 156 impart different insertion phases from each other, the input phase shifters 132, 152 may have different phase shifts than the "ideal" phase shifts depicted in FIG. 1.

As will be discussed in more detail below, the electrical length 144, $\theta_x$, of the carrier output circuit 140 and the electrical length 164 of the peaking output circuit 160 dictate the required input phase offset, $\theta_s$ (i.e., the phase difference between the carrier and peaking input RF signals at the carrier and peaking path inputs 133, 153), to ensure that the RF signals are combined coherently at the combining node 170.

The carrier input phase shifter 132, when included, may comprise distinct circuitry that forms a portion of the input circuitry 110, in one embodiment. In another embodiment, the functionality of the carrier input phase shifter 132 (i.e., the application of a phase shift to the carrier input RF signal) may be included in the power splitter 120. Similarly, the peaking input phase shifter 152 may include distinct circuitry that forms a portion of the input circuitry 110, in one embodiment. In another embodiment, the functionality of the peaking input phase shifter 152 (i.e., the application of a phase shift to the peaking input RF signal) may be included in the power splitter 120. In other words, the power splitter 120 may be configured to produce carrier and peaking RF input signals that have the desired input phase offset, and distinct input phase shifter(s) (e.g., phase shifter(s) 132, 152) may be excluded.

The carrier amplification path 130 includes a carrier input matching network (IMN) 134, the carrier amplifier 136, and a carrier output circuit 140. According to some embodiments, the carrier amplification path 130 also includes the carrier input phase shifter 132. Similarly, the peaking amplification path 150 includes a peaking EIN 154, the peaking amplifier 156, and a peaking output circuit 160. According to some embodiments, the peaking amplification path 150 also includes the peaking input phase shifter 152.

The carrier and peaking EINs 134, 154 are coupled between the carrier and peaking path inputs 133, 153 and the carrier and peaking amplifiers 136, 156, respectively. The carrier and peaking IMNs 134, 154 each may include, for example, lowpass or bandpass circuits configured as T or pi networks. For example, each of the carrier and peaking IMNs 134, 154 may include a T-network that includes two series-coupled inductors (e.g., wirebond arrays) with a shunt capacitor coupled to a node between the inductors. However they are configured, the IMNs 134, 154 incrementally increase the circuit impedance toward the source impedance.

The carrier and peaking amplifiers 136, 156 each have a control input 135, 155 (e.g., a gate terminal) and two current-carrying terminals 137, 138, 157, 158 (e.g., drain and source terminals), where one of the current-carrying terminals 137, 157 (e.g., the drain terminal) of each amplifier 136, 156 functions as an output for an amplified RF signal produced by the amplifier 136, 156, and the other current-carrying terminal 138, 158 (e.g., the source terminal) of each amplifier 136, 156 may be coupled to a ground reference node. According to an embodiment, current-carrying terminals 137, 157 (e.g., drain terminals) correspond to an intrinsic current generator (e.g., an intrinsic drain) of the amplifier 136, 156. Capacitances 139, 159 represent parasitic capacitances (e.g., drain-source capacitances) present at the outputs 137, 157 of the carrier and peaking amplifiers 136, 156 (e.g., at the drain terminals of the final-stage power transistors). Although capacitances 139, 159 are not discrete physical components (e.g., discrete capacitors), capacitances 139, 159 are shown to be included within the carrier and peaking output circuits 140, 160, as their capacitance values may be substantial enough to affect the electrical lengths 144, 164 of the carrier and peaking output circuits 140, 160. According to an embodiment, capacitances 139, 159 each have capacitance values in a range of about 0.25 picofarads (pF) to about 20 pF, although the capacitance values may be lower or higher, as well.

Each of the carrier and peaking amplifier 136, 156 includes one or more power transistors (e.g., field effect transistors) embodied in a semiconductor die (e.g., a single semiconductor die that includes both the carrier and peaking amplifier power transistors, or a separate die for each of the carrier and peaking amplifier transistors). In some embodiments, the semiconductor die(s) that include the carrier and peaking amplifiers 136, 156 may be packaged in a power amplifier package 120 (e.g., power amplifier package 430, FIG. 4), along with all or portions of the carrier and peaking IMNs 134, 154.

According to an embodiment, the carrier amplifier 136 and the peaking amplifier 156 each include a single-stage amplifier (i.e., an amplifier with a single amplification stage or power transistor). In other embodiments, the carrier amplifier 136 is a two-stage amplifier, which includes a relatively low-power driver amplifier (not shown) and a relatively high-power final-stage amplifier (not shown) connected in a cascade (or series) arrangement between the carrier amplifier input 135 and the carrier amplifier output 137. In the carrier amplifier cascade arrangement, an output (e.g., drain terminal) of the driver amplifier is electrically coupled to an input (e.g., gate terminal) of the final-stage amplifier. Similarly, the peaking amplifier 156 may include a two-stage amplifier, which includes a relatively low-power driver amplifier (not shown) and a relatively high-power final-stage amplifier (not shown) connected in a cascade arrangement between the peaking amplifier input 155 and the peaking amplifier output 157. In the peaking amplifier cascade arrangement, an output (e.g., drain terminal) of the driver amplifier is electrically coupled to an input (e.g., gate terminal) of the final-stage amplifier. In other embodiments, each of the carrier amplifier 136 and the peaking amplifier 156 may include more than two, cascade-coupled amplification stages.

As used herein, the "size" of an amplifier refers to the size of the output-stage transistor (i.e., the size of the single transistor in a single-stage amplifier, or the size of the final-stage transistor in a multi-stage amplifier). According to an embodiment, Doherty power amplifier 100 is asymmetric or highly-asymmetric, in that the carrier and peaking amplifiers 136, 156 are of substantially different sizes (i.e., the peripheries/current carrying capacities of the carrier and peaking power transistors are substantially different). In such embodiments, the peaking-to-carrier size (or periphery) ratio, α, may be in a range of about 1.15 to about 2.0 for example, although the range may have an even higher upper boundary, as well.

One or more bias circuits (e.g., bias circuits 146, 166) may provide DC bias voltages to the carrier and peaking amplifiers 136, 156 to ensure proper operation of the Doherty amplifier 100. Although FIG. 1 only illustrates output-side bias circuits 146, 166 (e.g., drain bias circuits), additional bias circuits (not shown) also may be implemented at the inputs (e.g., gate bias circuits) to the amplifiers 136, 156. During operation of Doherty amplifier 100, the carrier amplifier 136 is biased to operate in class AB mode or deep class AB mode, and the peaking amplifier 156 is biased to operate in class C mode or deep class C mode. In some configurations, the peaking amplifier 156 may be biased to operate in class B mode.

The carrier and peaking amplifiers 136, 156 are coupled to the combining node 170 through carrier and peaking output circuits 140, 160, respectively. At low to moderate input signal power levels (i.e., where the power of the input signal at RF input 102 is lower than the turn-on threshold level of peaking amplifier 156), the Doherty amplifier 100 operates in a low-power mode (or backoff condition mode) in which the carrier amplifier 136 operates to amplify the input signal, and the peaking amplifier 156 is minimally conducting (e.g., the peaking amplifier 156 essentially is in an off state). During this phase of operation, the carrier output circuit 140 determines the maximum VSWR (voltage standing wave ratio) to which the carrier amplifier 136 will be exposed. Conversely, as the input signal power increases to a level at which the carrier amplifier 136 reaches voltage saturation, the power splitter 120 divides the energy of the input signal between the carrier and peaking amplifier paths 130, 150, and both amplifiers 136, 156 operate to amplify their respective portion of the input signal.

As the input signal level increases beyond the point at which the carrier amplifier 136 is operating in compression, the peaking amplifier 156 conduction also increases, thus supplying more current to the CCL matching circuit 180 and antenna 106. In response, the load line impedance of the carrier amplifier output decreases. In fact, an impedance modulation effect occurs in which the load line of the carrier amplifier 136 changes dynamically in response to the input signal power (i.e., the peaking amplifier 156 provides active load pulling to the carrier amplifier 136). The carrier output circuit 140, which is coupled between the output 137 of the carrier amplifier 136 and the combining node 170, transforms the carrier amplifier load line impedance to a high value at backoff, allowing the carrier amplifier 136 to efficiently supply power to the CCL matching circuit 180 and antenna 106 over an extended output power range.

The electrical length 144 of the carrier output circuit 140, including the adjustment imparted by the parasitic output capacitance 139, corresponds to the phase shift applied by the carrier output circuit 140 to the carrier RF output signal between the carrier amplifier output 137 and the combining node 170. Similarly, the electrical length 164 of the peaking output circuit 160, including the adjustment imparted by the parasitic output capacitance 159, corresponds to the phase shift applied by the peaking output circuit 160 to the peaking RF output signal between the peaking amplifier output 157 and the combining node 170. According to one embodiment, and as mentioned above, the peaking output circuit 160, which is connected between the peaking amplifier output 157 and the combining node 170, may have an electrical length 164 equal to about 0 degrees. In another embodiment, the peaking output circuit 160 may have an electrical length 164 equal to about n*180 degrees (n=an integer value, such as 1, 2, 3, . . . ).

According to further embodiments, and as also mentioned above, the carrier output circuit 140, which is connected between the carrier amplifier output 137 and the combining node 170, has an electrical length 144, Ox. The input phase offset applied by the input circuitry 110 (e.g., the input phase offset established by phase shifter(s) 132, 152) is related to the electrical length 144 and the electrical length 164 of the peaking output circuit 160. More specifically, as described previously, the input phase offset is about equal to the electrical length 144, θx, of the carrier output circuit 140 when the electrical length 164 of the peaking output circuit 160 is about 0 degrees. Conversely, the input phase offset is about equal to n*180 degrees minus θx when the electrical length 164 of the peaking output circuit 160 is about n*180 degrees.

The carrier and peaking output circuits 140, 160 are configured to establish the desired electrical lengths 144, 164 discussed above. According to an embodiment, carrier output circuit 140 comprises a series inductance 141, an impedance transformation element 142, and a capacitor 143, electrically coupled in series between the carrier amplifier output 137 and the combining node 170. For example, the series inductance 141 may represent the inductance of various conductive structures (e.g., wirebonds and an output lead) between the carrier amplifier output 137 and the impedance transformation element 142. As described later in conjunction with FIG. 4, the impedance transformation element 142 may include, for example, a transmission line (e.g., transmission line 442, FIG. 4) coupled between inductance 141 and capacitor 143. Capacitor 143 is electrically coupled between impedance transformation element 142 and the combining node 170.

As will be described in more detail in conjunction with FIG. 2, inductance 141, impedance transformation element 142, and capacitor 143 form portions of a carrier output matching network (OMNc), which is configured to further increase the circuit impedance toward the load impedance. According to an embodiment, the carrier OMN may further include one or more shunt passive elements that configure the OMN as a T or pi output matching network. For example, as will be described in conjunction with FIG. 2, below, a T-network may be established by including a first shunt passive element 145 between the carrier amplifier output 137 and impedance transformation element 142. For example, the first shunt passive element 145 may be a shunt inductance or capacitance provided by a portion of bias circuit 146 (e.g., a drain feed line of the bias circuit 146). According to an embodiment, the first shunt passive element 145 may be considered to be variable, in that the length of the drain feed line may be readily modified during design of amplifier 100, as will be discussed in more detail in conjunction with FIG. 4, and thus the value of the shunt inductance or capacitance may be readily selected during design. A pi-network may be established by including an additional shunt passive component (e.g., capacitor 148) along the impedance transformation element 142 (or between the impedance transformation element 142 and capacitor 143).

Similarly, and according to a further embodiment, peaking output circuit 160 comprises a series inductance 161, an impedance transformation element 162, and a capacitor 163, electrically coupled in series between the peaking amplifier output 157 and the combining node 170. For example, the series inductance 161 may represent the inductance of various conductive structures (e.g., wirebonds and an output lead) between the peaking amplifier output 157 and the impedance transformation element 162. As described later in conjunction with FIG. 4, the impedance transformation element 162 may include, for example, a transmission line segment (e.g., transmission line 462, FIG. 4) coupled between inductance 161 and capacitor 163. Capacitor 163 is electrically coupled between impedance transformation element 162 and the combining node 170.

As will be described in more detail in conjunction with FIG. 2, inductance 161, impedance transformation element 162, and capacitor 163 form portions of a peaking OMN (OMNp), which is configured to further increase the circuit impedance toward the load impedance. According to an embodiment, the peaking OMN may further include one or more shunt passive elements that configure the OMN as a T or pi output matching network. Again, as will be described in conjunction with FIG. 2, below, a T-network may be established by including a first shunt passive element 165 between the peaking amplifier output 157 and impedance transformation element 162. For example, the first shunt passive element 165 may be a shunt inductance or capacitance provided by a portion of bias circuit 166 (e.g., a drain feed line of the bias circuit 146). According to an embodiment, the first shunt passive element 165 may be considered to be variable, in that the length of the drain feed line may be readily modified during design of amplifier 100, as will be discussed in more detail in conjunction with FIG. 4, and thus the value of the shunt inductance or capacitance may be readily selected during design. A pi-network may be established by including an additional shunt passive component (e.g., capacitor 168) along the impedance transformation element 162 (or between the impedance transformation element 162 and capacitor 163).

As discussed above, the carrier and peaking output circuits 140, 160 inherently include output matching networks comprised of an assembly of output circuit components. The carrier and peaking output matching networks can have a number of different configurations, while still achieving substantially the same performance and benefits of the embodiment of FIG. 1. To further illustrate, FIG. 2 is a schematic representation of a portion of a Doherty amplifier 200, which generically illustrates the carrier and peaking output matching networks, in accordance with another example embodiment. More specifically, FIG. 2 is intended to convey a variety of "lumped equivalent circuits" that may be considered during design of an output circuit (e.g., output circuit 140, 160, FIG. 1) of a Doherty power amplifier (e.g., amplifier 100, 400, FIGS. 1, 4).

As with the Doherty amplifier of FIG. 1, Doherty amplifier 200 includes a carrier amplifier 136 and a peaking amplifier 156. Although not shown in FIG. 2, inputs 135, 155 of the carrier and peaking amplifiers 136, 156 could be coupled through input matching networks (e.g., IMNs 134, 154, FIG. 1) and phase shift elements (e.g., phase shift elements 132, 152, FIG. 1) to a power splitter (e.g., power splitter 120, FIG. 1). Further, one current-carrying terminal 138, 158 (e.g., a source terminal) of each amplifier 136, 156 may be coupled to a ground reference, and a parasitic capacitance 139, 159 (e.g., drain-source capacitance) may be present between the current-carrying terminals 137, 138, 157, 158 of each amplifier 136, 156. In the embodiment of FIG. 2, an OMN 240, 260 is coupled between an output terminal 137, 157 (e.g., a drain terminal) of each amplifier 136, 156 and a combining node 170. Further, a CCL matching circuit 180 is coupled between the combining node 170 and an RF output 190, which in turn may be coupled to an antenna 106 (or another load).

Each of the carrier and peaking OMNs 240, 260 may be configured as a T-network (i.e., a shunt component connected between two series components), a pi-network (i.e., two shunt components connected to opposite terminals of a series component), or as another type of output matching network. A generic representation of a T-network 270 is shown in box 271, and a generic representation of a pi-network 280 is shown in box 281, where the carrier and peaking OMNs 240, 260 could be implemented as any one of multiple variants of either the generic T-network or the generic pi-network. Those of skill in the art would understand, based on the description herein, that the generic representations of networks 270, 280 are intended to convey a plurality of lumped element equivalent circuit configurations that may be considered during the design of a Doherty power amplifier (e.g., amplifier 100, 400, FIGS. 1, 4). The various configurations shown in FIG. 2 are not necessarily interchangeable, and would not give rise to substantially the same performance. In some cases, some configurations would be inappropriate for a given design, and may lead to degraded performance.

More specifically, T-network 270 includes an input 272, an output 273, two "series" components 274, 275 coupled in series between the input 272 and output 273, and a "shunt" component 276 coupled to a node between the two series components 274, 275. The input 272 of T-network 270 would be coupled to the output 137, 157 of an amplifier 136, 156, and the output 273 of T-network 270 would be coupled to the combining node 170. Each of the components 274-276 could be an inductor or a capacitor, as indicated with the dashed connecting lines. For example, but not by way of limitation, one embodiment of a T-network 278 that is suitable for OMNs 240, 260 is shown in box 279, where the first series component 274 of the generic T-network 270 is selected to be an inductor, the second series component 275 of the generic T-network 270 is selected to be a capacitor, and the shunt component 276 of the generic T-network 270 is selected to be a second capacitor. Another non-limiting embodiment of a T-network 278' that is suitable for OMNs 240, 260 is shown in box 279', where the first series component 274 of the generic T-network 270 is selected to be an inductor, the second series component 275 of the generic T-network 270 is selected to be a capacitor, and the shunt component 276 of the generic T-network 270 is selected to be a second inductor.

The pi-network 280 includes an input 282, an output 283, a "series" component 285 coupled between the input 282 and output 283, and two "shunt" components 286, 287. The input 282 of pi-network 280 would be coupled to the output 137, 157 of an amplifier 136, 156, and the output 283 of pi-network 280 would be coupled to the combining node 170. Series component 285 is coupled between the input 282 and the output 283. One shunt component 286 is coupled to a node between the input 282 and component 285, and the other shunt component 287 is coupled to a node between component 285 and the output 283. Each of the components 285-287 could be an inductor or a capacitor, as indicated with the dashed connecting lines. For example, but not by way of limitation, one embodiment of a pi-network 288 that is suitable for OMNs 240, 260 is shown in box 289. As illustrated, pi-network 288 includes a series inductor and two shunt capacitors. Another embodiment of a pi-network 288', which is shown in box 289', includes a series inductor, a shunt inductor, and a shunt capacitor. Yet another embodiment of a pi-network 288", which is shown in box 289", includes a series capacitor, a shunt capacitor, and a shunt inductor. Pi-networks 288, 288', and 288" are provided by way of example only. Pi-networks that include different combinations of components 285-287 could be used in still other alternate embodiments.

The components 274-276, 285-287 may be selected to be inductors and/or capacitors with inductance and capacitance values, respectively, that result in maximum signal energy transfer through the OMNs 240, 260 at the center frequency of operation of the amplifier 200.

The selection of each of components 274-276, 285-287 as an inductor or a capacitor in part depends on the impedance value, $Z_L$, of the CCL matching circuit 180. As will be described below, $Z_L$ has a non-zero reactive portion, $x_n$, which may be positive or negative.

At peak power (e.g., saturation), carrier OMN 240 should match the complex impedance (Zopt'=$Z_L$*(1+α)) to the optimal load impedance, Ropt, and at backoff condition (e.g., low power), carrier OMN 240 should match the complex impedance $Z_L$ to load impedance Rmod. At peak power, peaking OMN 260 should transform the complex impedance (Zpeak'=$Z_L$*(1+α)/α) to Ropt, and at backoff condition, the impedance should appear transparent (i.e., looking into OMNp 260 from node 170, the impedance should emulate an open circuit (e.g., infinite ohms) so as not to load the combining node 170). Accordingly, at backoff, OMNp should provide open-to-open, and thus have an electrical length of 0 degrees or 180 degrees.

Figure 3:
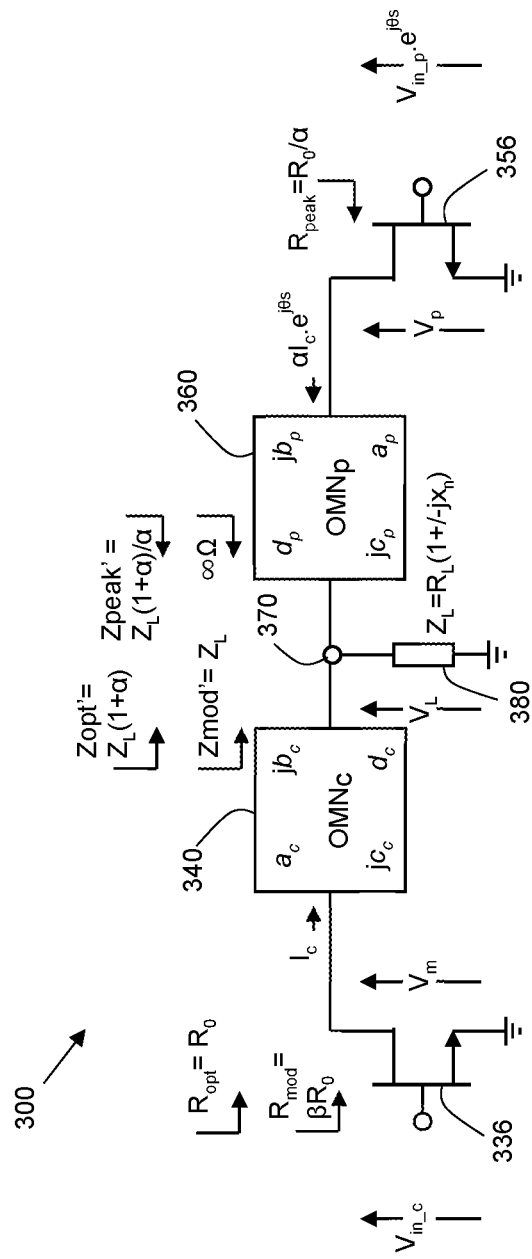
FIG. 3 is a simplified schematic representation of an asymmetric Doherty power amplifier, in accordance with another example embodiment.
Figure 4:
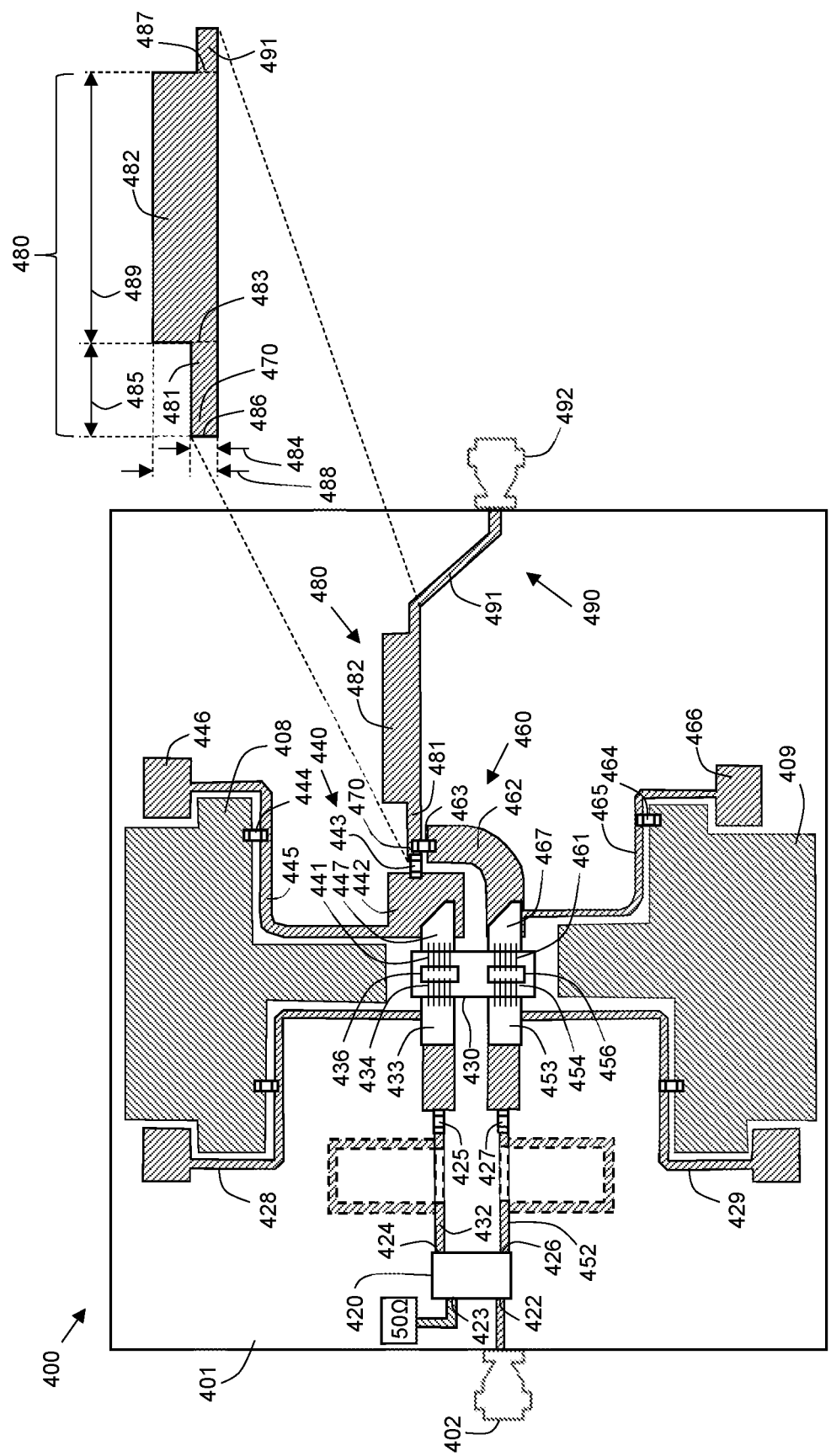
FIG. 4 is a top view of a physical implementation of an asymmetric Doherty power amplifier with a complex combining load matching circuit, in accordance with an example embodiment.

The above-described lumped element equivalent circuits 270, 278, 278', 280, 288, 288', 288" may or may not be suitable for unmodified adoption into Doherty power amplifiers 100, 300, 400, FIGS. 1, 3, 4. For a practical implementation, and in particular for high-power amplifiers, Doherty power amplifiers 100, 300, 400 may, for example, benefit from the use of distributed circuit elements (e.g., transmission line matching element 142, FIG. 1) and additional circuits and circuit elements (e.g., shunt passive element 145 and optional shunt capacitor 148, FIG. 1) in an output circuit to achieve acceptable performance and power handling capability. A substantially lumped element matching approach for the final matching circuit may be more convenient to implement and provide PCB area savings for certain low power applications.

Referring again to FIG. 1, the above-described configurations provide correct phase relationships for optimal load modulation, and ensure that the amplified signals from the carrier and peaking paths 130, 150 arrive in phase (or coherently) at the combining node 170. Combining node 170 includes a conductive structure that is suitable for combining the amplified RF signals produced by the carrier and peaking amplification paths 130, 150.

According to an embodiment, a CCL matching circuit 180 (i.e., a circuit providing a resistive component and a reactive component) is coupled between the combining node 170 and the RF output 190. The CCL matching circuit 180 is connected to RF output 190, which in turn is connected to antenna 106, in an embodiment. In a physical implementation of Doherty amplifier 100, RF output 190 may be implemented, for example, with a 50 ohm transmission line (e.g., transmission line 491, FIG. 4) and an RF output connector (e.g., connector 492, FIG. 4).

Figure 2:
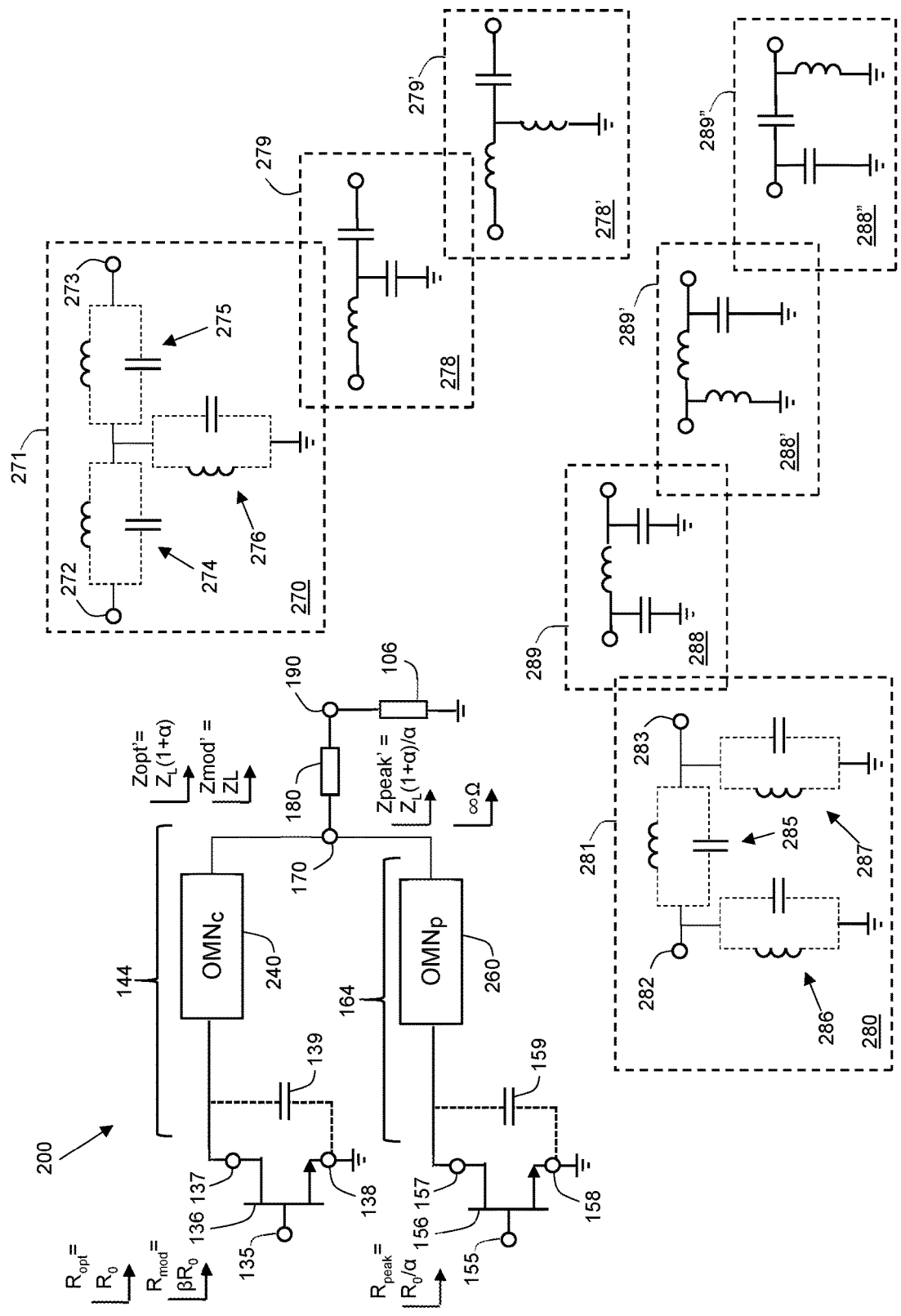
FIG. 2 is a generalized schematic representation of various output matching networks for a Doherty power amplifier, in accordance with an example embodiment.

Reference is now made to FIG. 3, which is a functional block diagram of a portion of an asymmetric CCL Doherty amplifier 300 (e.g., amplifier 100, 200, 400, FIGS. 1, 2, 4). Amplifier 300 includes unequal-sized (asymmetric) transistors 336, 356 (e.g., amplifiers 136, 156, FIGS. 1, 2), carrier and peaking output matching networks 340, 360 (e.g., OMNc 240 and OMNp 260, FIG. 2), and a combining node 370 (e.g., combining node 170, FIGS. 1, 2) coupled to a CCL matching circuit 380 (e.g., CCL matching circuit 180, FIGS. 1, 2). The CCL matching circuit 380 provides or presents a complex combining load impedance, $Z_L$, to the combining node 370 that can be represented as:

$$Z_L = R_L(1+/-jx_n),\quad\quad\quad\text{(Eqn. 1)}$$

where $R_L$ is a load resistance value (free design variable, such as 10-100 ohms, or some other value), and $x_n$ is the normalized value of the reactive portion of the complex impedance, or the normalized load reactance. In other words, the complex combining load impedance provided or presented by the CCL matching circuit 380 has a non-zero, positive or negative, normalized reactive portion, $x_n$.

Essentially, the CCL matching circuit 380 transforms the complex load impedance $Z_L$ to the impedance of a load to which the CCL matching circuit 380 is coupled (e.g., load 106, with an impedance of, for example, 50 ohms). The absolute value of $x_n$ is non-zero, in an embodiment (otherwise the CCL matching circuit 380 would result in a real load characterized only by a real impedance). In other words, according to an embodiment, the load impedance, $Z_L$, is complex (i.e., the load impedance has a non-zero reactive portion). According to more specific embodiments, the normalized load reactance, $x_n$, has an absolute value in a range of about 0.1 to about 5.3, which supports input phase offsets in a range of about 15 degrees to about 165 degrees and about 195 degrees to about 345 degrees. In another embodiment, the normalized load reactance, $x_n$, has an absolute value in a range of about 1.0 to about 2.0 (e.g., 1.267, or other values within this range). As will be described in more detail later in conjunction with FIG. 4, an embodiment of the CCL matching circuit 380 is implemented with first and second transmission line segments connected in series between the combining node 370 and an RF output (e.g., RF output 190, FIG. 1).

The load modulation range, β, is the ratio of the load impedance seen by the intrinsic current generator of the carrier device at the design output backoff (OBO) condition to the load impedance seen at the peak power operating condition, and in various embodiments, the value of β is in a range of about 2.2 to about 40. The design output backoff (OBO), which equals 10 log ((1+α)β), determines the required value of the normalized load reactance, $x_n$, presented to combining node 370 by the CCL matching circuit 380. As is understood by those of skill in the art, $R_0$ represents the optimum load impedance, Ropt at a saturation condition (i.e., $R_0 = V_S/I_S$, where $V_S$ is the saturation drain voltage, and $I_S$ is the saturation current). When the peaking transistor 356 is non-conducting (i.e., in a low power condition), the peaking OMN 360 presents an open circuit to the combining node 370 (i.e., ∞ ohms), while the carrier OMN 340 transforms Zmod'=$Z_L$ to $R_{mod}$=β$R_0$. Conversely, when the peaking transistor 356 is conducting (i.e., in a saturation condition), the peaking OMN 360 transforms Zpeak'=$Z_L$(1+α)/α to $R_{peak}$=$R_0$/α, while the carrier OMN 340 transforms Zopt'=$Z_L$(1+α) to Ropt=$R_0$.

According to an embodiment, the normalized reactance, $x_n$, of the load impedance as a function of α and β is as follows:

$$x_n = \pm \sqrt{\frac{[(1+\alpha)\beta - 1][\beta - (1+\alpha)]}{\alpha^2 \beta}} \quad \text{(Eqn. 2)}$$

where α is the peaking-to-carrier size (or periphery) ratio, as discussed previously, and # is the load modulation range, and $$\beta = 10^{\left(\frac{OBO}{10}\right)} / (1+\alpha) \quad \text{(Eqn. 3)}$$

For given values of $R_0$, $R_L$, $x_n$, α, and β, the ABCD parameters for the carrier OMN 340 are given by the following equations:

$$a_c = -R_0(\beta - (1+\alpha))\frac{c_c}{\alpha x_n} \quad \text{(Eqn. 4)}$$

$$b_c = R_0 R_L(1+\alpha)(\beta - 1)\frac{c_c}{\alpha} \quad \text{(Eqn. 5)}$$

$$c_c = \pm \sqrt{\frac{(1+\alpha)\beta - 1}{R_0 R_L(1+\alpha)(\beta-1)(\beta+1)}} \quad \text{(Eqn. 6)}$$

$$d_c = R_L(1+\alpha)\left[\frac{\beta - 1}{(1+\alpha)\beta - 1}\right]c_c x_n \quad \text{(Eqn. 7)}$$

Further, the ABCD parameters for the peaking OMN 360 are given by the following equations:

$$a_p = \pm \sqrt{\frac{R_0}{R_L(1+\alpha)}} \quad \text{(Eqn. 8)}$$

$$b_p = \mp \sqrt{R_0 R_L(1+\alpha)} * \frac{x_n}{\alpha} \quad \text{(Eqn. 9)}$$

$$c_p = 0 \quad \text{(Eqn. 10)}$$

$$d_p = \pm \sqrt{\frac{R_L(1+\alpha)}{R_0}} \quad \text{(Eqn. 11)}$$

The roots of the peaking OMN 360 terms $a_p$ and $d_p$ may be either positive or negative, but they must always have the same sign to ensure that the network obeys reciprocity. A consequence of this is that positive signed terms $a_p$ and $d_p$ give rise to a peaking OMN insertion phase of 0 degrees (i.e., the electrical length of the peaking output circuit is 0 degrees) or n*180 degrees where n=an even integer, and negative signed terms $a_p$ and $d_p$ give rise to a peaking OMN insertion phase of 180 degrees (i.e., the electrical length of the peaking output circuit is 180 degrees) or n*180 degrees where n=an odd integer. This has significant consequences, in that it provides flexibility of choice for phasing relationships of the output combiner network.

For clarity, the sign of the peaking OMN term bp must have an opposite sign to $a_p$ and $d_p$ for positive values of $x_n$, and must have the same sign as $a_p$ and $d_p$ for negative values of $x_n$. In Eqn. 9, above, the inverted ∓ symbol for term $b_p$ is used to signify this sign relationship.

The carrier OMN term $c_c$ may have either positive or negative sign. Because $c_c$ may have a different sign from $a_p$ and $d_p$ (where $a_p$ and $d_p$ have the same sign), four different circuit permutations are possible for each sign of $x_n$, with eight total permutations, as listed below. Each permutation may have different circuit elements and values. Accordingly, the various permutations may be utilized to produce optimal solutions for different applications, (e.g. high power versus low power designs, different frequency bands, different bandwidth requirements, and so on).

The electrical length 144, $\theta_x$, of the carrier output circuit 140 and the electrical length 164 of the peaking output circuit 160 dictate the required input phase offset, $\theta_S$, to ensure that the RF signals are combined coherently at the combining node 170. Specifically, the difference in the electrical length of the peaking output circuit (i.e., 0 degrees or n*180 degrees) and the electrical length of the carrier output circuit (i.e., $\theta_x$) is equal to the required input phase offset, $\theta_s$. This may be expressed as follows, $\theta_s=0$ degrees−$\theta_x=-\theta_x$ when the peaking output circuit electrical length is 0 degrees, and $\theta_s=n*180$ degrees−$\theta_x$ when the peaking output circuit electrical length is n*180 degrees. The electrical length of the carrier output circuit, $\theta_x$, and thus input phase offset, $\theta_s$, are mathematically related to the complex impedance, $Z_L$, generated by the CCL matching circuit 180. More specifically, the value of input phase offset $\theta_s$ is derived from the normalized load reactance, $x_n$, (or the normalized value of the reactive portion of the complex impedance) as follows:

$$\theta_s = \tan^{-1}\left[\frac{(1+\alpha)\beta-1}{\alpha\beta x_n}\right] + k\pi \qquad \text{(Eqn. 12)}$$

$\theta_s$, as expressed in Eqn. 12, gives the phase of the peaking path RF signal at input 153 with respect to the phase of the carrier path RF signal at input 133. When Bs is positive, it implies that the peaking path RF signal at input 153 leads the carrier path RF signal at input 133, and when $\theta_s$ is negative, it implies that the peaking path RF signal at peaking input 153 lags the carrier path RF signal at input 133. By restricting the peaking output circuit electrical length to be either 0 degrees or 180 degrees (which may be the most commonly implemented electrical lengths), the values of k in Eqn. 12 may be −1, 0, +1 or +2, and the eight circuit permutations are as follows:

Permutations 1 and 2:
For positive values of $x_n$ and positive $c_c$:
k=−1 for positive $a_p$ and $d_p$, and
k=0 for negative $a_p$ and $d_p$.
Permutations 3 and 4:
For negative values of $x_n$ and positive $c_c$:
k=0 for positive $a_p$ and $d_p$, and
k=+1 for negative $a_p$ and $d_p$.
Permutations 5 and 6:
For positive values of $x_n$ and negative $c_c$:
k=0 for positive $a_p$ and $d_p$, and
k=+1 for negative $a_p$ and $d_p$.
Permutations 7 and 8:
For negative values of $x_n$ and negative $c_c$:
k=+1 for positive $a_p$ and $d_p$, and
k=+2 for negative $a_p$ and $d_p$.

As mentioned above, Eqn. 12 for input phase offset, $\theta_s$, together with the values of k for the eight circuit permutations are limited to the cases where the peaking output circuit electrical length is either 0 degrees or 180 degrees. As also mentioned earlier, a peaking output circuit electrical length of 0 degrees will result in positive $a_p$ and $d_p$, and a peaking output circuit electrical length of 180 degrees will result in negative $a_p$ and $d_p$. The resulting input phase offsets derived using the calculations above provide equalized carrier and peaking amplification path insertion phases. Put another way, the total carrier amplification path insertion phase from the input splitter output 124 to combination node 170 will be equal to the total peaking amplification path insertion phase from the input splitter output 126 to the combination node 170. This results in equalized carrier and peaking amplification path group delays and maximized RF bandwidth.

According to an embodiment, when the ABCD parameter $c_c$ for the carrier output circuit 140 is a positive value (see Eqn. 6, above) the electrical length 144, $\theta_x$, of the carrier output circuit 140 always is positive, and the absolute ranges for the input phase offset, $\theta_s$, and the electrical length 144, $\theta_x$, of the carrier output circuit 140 are the same (although the values of $\theta_s$ and $\theta_x$ may be different within those ranges). Specifically, when the ABCD parameters $a_p$ and $d_p$ for the peaking output circuit 160 are either positive or negative values (e.g., the electrical length 164 of the peaking output circuit 160 is about 0 degrees or 180 degrees) (see Eqns 8 and 11, above), the input phase offset, $\theta_s$, at the carrier and peaking path inputs 133, 153 may be in a first range from about 15 degrees to about 165 degrees (i.e., the input phase offset, $\theta_s$, corresponds to a phase difference of 15 degrees to 165 degrees between the carrier and peaking input RF signals at the carrier and peaking path inputs 133, 153), and the electrical length 144, $\theta_x$, of the carrier output circuit 140 also may be in the first range from about 15 degrees to about 165 degrees. In some embodiments, $\theta_s$ and $\theta_x$ are within the first range, but are smaller or larger than an exclusion zone centered around about 90 degrees (e.g., the exclusion zone is between 86 degrees and 94 degrees, and θs and Ox are between 15 degrees and 86 degrees or between 94 degrees and 165 degrees). Said another way, under the above conditions for $c_c$, $a_p$, and $d_p$, $\theta_s$ and $\theta_x$ may be between 15 degrees and 165 degrees, excluding phase offsets (or electrical lengths) between 86 degrees and 94 degrees.

In contrast, when the ABCD parameter $c_c$ for the carrier OMN 140 is a negative value (see Eqn. 6, above) the electrical length 144, $\theta_x$, of the carrier output circuit 140 is negative. According to an embodiment, the electrical length 144, $\theta_x$, of the carrier output circuit 140 may be in a second range from about −165 degrees to about −15 degrees. In a more specific embodiment, $\theta_x$ may be within the second range, but may be smaller or larger than an exclusion zone centered around about −90 degrees (e.g., the exclusion zone is between −94 and −86 degrees, and $\theta_x$ is between −165 degrees and −94 degrees or between −86 degrees and −15 degrees). Further, the sign of the input phase offset, $\theta_s$, depends on the sign of the ABCD parameters $a_p$ and $d_p$ for the peaking output circuit 160. More specifically, when:

a) the ABCD parameters $a_p$ and $d_p$ for the peaking output circuit 160 are positive values (e.g., the electrical length 164 of the peaking output circuit 160 is about 0 degrees) (see Eqns 8 and 11, above), the absolute value of the input phase offset, $\theta_s$, may be in a first range from about 15 degrees (i.e., 0-(−15) degrees) to about 165 degrees (i.e., 0-(−165) degrees). In some embodiments, $\theta_s$ may be within the first range, but may be smaller or larger than an exclusion zone centered around about 90 degrees (e.g., the exclusion zone may be between 86 degrees and 94 degrees, and $\theta_s$ may be between 15 degrees and 86 degrees or between 94 degrees and 165 degrees). Said another way, under the above conditions for $c_c$, $a_p$, and $d_p$, the absolute value of $\theta_s$ may be between 15 degrees and 165 degrees, excluding phase offsets between 86 degrees and 94 degrees.

b) the ABCD parameters $a_p$ and $d_p$ for the peaking output circuit 160 are negative values (i.e., the electrical length 164 of the peaking output circuit 160 is about 180 degrees) (see Eqns 8 and 11, above), the absolute value of the input phase offset, $\theta_s$, may be in a second range from about 195 degrees (i.e., 180-(−15)) to about 345 degrees (i.e., 180-(−165)). In some embodiments, θs may be within the first range, but may be smaller or larger than an exclusion zone centered around about 270 degrees (e.g., the exclusion zone may be between 266 degrees and 274 degrees, and $\theta_s$ may be between 195 degrees and 266 degrees or between 274 degrees and 345 degrees). Said another way, under the above conditions for $c_c$, $a_p$, and $d_p$, the absolute value of $\theta_s$ may be between 195 degrees and 345 degrees, excluding phase offsets between 266 degrees and 274 degrees.

It should be noted that there may be other solutions for the electrical length 144, $\theta_x$, of the carrier output circuit 140, and that it may be possible to adjust the electrical length 144, $\theta_x$, by adding or subtracting integer multiples of 360 degrees. This implies that the electrical length 144, $\theta_x$, of the carrier output circuit may be expressed as $\theta_x$, or may be expressed as a modified value $\theta_x \pm m*360$ degrees, where m is a positive integer. When ABCD parameter $c_c$ (see Eqn. 6, above) for the carrier output circuit 140 is positive, the electrical length 144, $\theta_x$, is positive (i.e., carrier output circuit 140 is a phase lag circuit), and when $c_c$ is negative, the electrical length 144, $\theta_x$, is negative (i.e., carrier output circuit 140 is a phase lead circuit). Equations 4 to 7, above, provide solutions for carrier output circuit 140 with a minimized positive electrical length when the ABCD parameter $c_c$ is positive, and a minimized negative electrical length when the ABCD parameter $c_c$ is negative. Put another way, equations 4 to 7, above, are restricted to the case where the carrier output circuit electrical lengths are not modified by $\pm m*360$ degrees, and this is not intended to be limiting in any way. As an example, if the ABCD parameter $c_c$ is negative, and the electrical length 144, $\theta_x$, of the carrier output circuit 140 is, for example, negative 85 degrees, then it may be possible to adjust the carrier output circuit electrical length 144, $\theta_x$, from negative 85 degrees to positive 275 degrees by adding 360 degrees.

Those of skill in the art will appreciate, based on the discussion herein, that optimum RF bandwidth performance may be obtained by implementing circuit solutions with minimized electrical length (minimized insertion phase), and that it may in many cases be more practical to implement phase lag output matching networks as opposed to phase lead matching networks. In particular, when the ABCD parameter $c_c$ is negative, resulting in a corresponding negative electrical length 144, $\theta_x$, it may be possible to modify the electrical length 144 by adding 360 degrees (i.e., the electrical length 144 of the carrier output circuit 140 may be modified to be $\theta_x+360$ with a resulting positive electrical length that may, in many cases, be more practical to implement).

Those skilled in the art may appreciate, based on the description herein, that the input phase offset may be adjusted by multiples of +/−360 degrees and still yield optimal band center performance, but such adjustments may compromise RF bandwidth performance. This may nevertheless be useful in some design cases in which the designer may wish to reduce maximum input delay line lengths. However, in such cases, the designer may want to consider the potential impact on RF bandwidth for a given application. Those skilled in the art will further appreciate, based on the description herein, that when a given design scenario warrants a peaking output circuit electrical length greater than 180 degrees (i.e., n=1), such as a peaking output circuit electrical length of 360 degrees (i.e., n=2), the relationships for the input phase offset provided above should be carefully evaluated for the specific design scenario.

As indicated above, the input phase offset at the carrier and peaking path inputs 133, 153, which is dependent upon the electrical length of phase shifters 132, 152 (or input offset lines) (e.g., 0 degrees, $\theta_x$ degrees, or n*180 degrees−$\theta_x$ degrees), is in a first range from about +/−15 degrees to about +/−165 degrees or in a second range from about +/−195 degrees to about +/−345 degrees (i.e., the input phase offset corresponds to a phase difference of +/−15 degrees to +/−165 degrees or +/−195 degrees to +/−345 degrees between the carrier and peaking input RF signals at the carrier and peaking path inputs 133, 153). For example, when $x_n=+1.267$ (i.e., $Z_L=R_L(1+j1.267)$), $\alpha=2$, and $c_c$ is positive, the electrical length 144, $\theta_x$, of the carrier output circuit 140 equals about 132 degrees, and the corresponding input phase offset at the peaking path input 153 with respect to carrier path input 133 equals about −132 degrees when the peaking output circuit electrical length is about 0 degrees. Said another way, when the peaking phase shifter 152 (or input offset line) has an electrical length of 132 degrees, this results in a corresponding input phase offset of −132 degrees at the peaking path input 153 with respect to the carrier path input 133.

Those of skill in the art understand that, during operation of a Doherty amplifier, a first efficiency peak occurs at backoff power, and a second efficiency peak occurs at saturation power. Essentially, the output backoff (OBO) is the difference (in decibels (dB)) between the first and second efficiency peaks. For a conventional asymmetric Doherty amplifier with a real load (i.e., $x_n=0$), the OBO is about 6.6 dB when $\alpha=1.15$, and the OBO is about 9.5 dB when $\alpha=2$. Conversely, in accordance with various embodiments, implementation of a complex combining load matching circuit (e.g., CCL matching circuit 180) providing a normalized load reactance, $x_n$, with an absolute value in a range of about 0.1 to about 5.3 may support OBO levels from about 6.7 dB to about 16 dB for an asymmetric Doherty amplifier 100 with $\alpha=1.15$, and may support OBO levels from about 9.6 dB to about 21 dB for a highly-asymmetric Doherty amplifier 100 with $\alpha=2$. According to the above-given example when $x_n=+1.267$ (i.e., $Z_L=R_L(1+j1.267)$ and $\alpha=2$, for example, the OBO is about 12 dB. Essentially, the larger the normalized load reactance, $x_n$, the deeper the backoff peak (i.e., the larger the OBO). It can be noted that a potential advantage in increasing the asymmetry ratio, $\alpha$, for an asymmetric CCL Doherty amplifier, as compared with a symmetric CCL Doherty amplifier, is that such an increase may allow a designer to use a lower normalized load reactance, $x_n$, for a given OBO level. This may provide some advantage by reducing the Q (quality factor) of the CCL load network, which may thereby reduce matching design sensitivities and may increase bandwidth.

A physical implementation of Doherty amplifier 100 (FIG. 1) will now be described in conjunction with FIG. 4, which is a top view of a Doherty amplifier 400 with a complex Doherty combining load matching circuit 480, in accordance with an example embodiment. The components of Doherty amplifier 400 are coupled to and/or mounted on a substrate 401, such as a single-layer or multi-layer printed circuit board (PCB), for example. A patterned conductive layer on the top surface of substrate 401 includes a plurality of conductive features (e.g., conductive features 408, 409, 432, 442, 445, 452, 462, 465, 481, 482, 490) that function to electrically connect the various components of Doherty amplifier 400 to each other or to external voltage sources and/or voltage references (e.g., a ground reference).

Doherty amplifier 400 includes an input RF connector 402 (e.g., RF input 102, FIG. 1), a power splitter 420 (e.g., power splitter 120, FIG. 1), a carrier input transmission line 432, a peaking input transmission line 452, a carrier amplifier 436 (e.g., carrier amplifier 136, FIG. 1), a peaking amplifier 456 (e.g., peaking amplifier 156, FIG. 1), a carrier output circuit 440 (e.g., carrier output circuit 140, FIG. 1), a peaking output circuit 460 (e.g., peaking output circuit 160, FIG. 1), a combining node 470 (e.g., combining node 170, FIG. 1), a CCL matching circuit 480 (e.g., CCL matching circuit 180, FIG. 1), and an RF output 490 (e.g., RF output 190, FIG. 1).

The carrier and peaking amplifiers 436, 456 may be implemented as power transistors on one or more semiconductor dies, as mentioned previously. According to an embodiment, the carrier and peaking amplifiers 436, 456 may be packaged in a discrete, high-power amplifier package 430, which also includes carrier and peaking input leads 433, 453 and carrier and peaking output leads 447, 467, along with electrical connections (e.g., wirebond arrays 434, 441, 454, 461, as shown) that electrically connect the leads 433, 453, 447, 467 to the inputs (e.g., gate terminals) and the outputs (e.g., drain terminals) of the amplifiers 436, 456. The high-power amplifier package 430 may be coupled to the substrate 401 in a manner that provides a ground reference to the amplifiers 436, 456, and which also provides a heat sink for thermal energy generated by the amplifiers 436, 456, during operation. For example, the substrate 401 may include a conductive coin or thermal vias, and the amplifier package 430 may be coupled to the substrate 401 over the conductive coin or thermal vias. Electrical connections (e.g., solder or conductive adhesive) are provided between the leads 433, 453, 447, 467 and conductive features (e.g., transmission lines 432, 442, 452, 462) on the top surface of the substrate 401, as shown in FIG. 4.

The input RF connector 402 is electrically coupled to an input 422 (or a first port) of the power splitter 420. For example, a conductive trace or transmission line on the substrate 401 may electrically connect the input RF connector 402 to input 422 (e.g., input 122, FIG. 1) of the power splitter 420. A second port 423 of the power splitter 420 may be coupled to a 50 ohm termination to ground. The power splitter 420 may be a discretely-packaged component mounted to the surface of substrate 401, in one embodiment, or may be implemented using conductive traces on the substrate 401. Either way, the power splitter 420 is configured to divide the power of the input RF signal received at power splitter input 422 into carrier and peaking portions of the input signal (i.e., the carrier input RF signal and the peaking input RF signal). The carrier input RF signal is provided to the carrier amplification path at power splitter output 424 (or a third port, e.g., splitter output 124, FIG. 1), and the peaking input RF signal is provided to the peaking amplification path at power splitter output 426 (or a fourth port, e.g., splitter output 126, FIG. 1).

The carrier input RF signal is conveyed to an input (e.g., gate terminal) of the carrier amplifier 436 through carrier input transmission line 432 and DC blocking capacitor 425, and the peaking input RF signal is conveyed to an input (e.g., gate terminal) of the peaking amplifier 456 through peaking input transmission line 452 and DC blocking capacitor 427. According to an embodiment, each of the carrier and peaking input transmission lines 432, 452 may serve the functionality of a phase shifter (e.g., phase shifters 132, 152, FIG. 1) by having an electrical length that imparts a desired input phase offset between the carrier and peaking input signals at the inputs to the carrier and peaking amplifiers 436, 456. For example, the electrical length of each of the carrier and peaking input transmission lines 432, 452 may be established by designing each of the transmission lines to have a physical length that corresponds, at the center operational frequency of the amplifier 400, to the desired electrical length of the transmission line 432, 452. As indicated above, the carrier input transmission line 432 may have an electrical length of 0 degrees or n*180 degrees−$\theta_x$, and the electrical length of the peaking input transmission line 452 may have an electrical length of $\theta_x$, or zero degrees, in various embodiments. In FIG. 4, portions of the carrier and peaking input transmission lines 432, 452 are shown with dashed lines to indicate different potential electrical lengths of the lines.

Gate bias circuits 428, 429 may be included to enable gate bias voltages to be provided to the inputs (e.g., gate terminals) of amplifiers 436, 456. In addition, drain bias circuits 446, 466 (e.g., drain bias circuits 146, 166, FIG. 1) may be included to enable drain bias voltages to be provided to the outputs (e.g., drain terminals) of amplifiers 436, 456. Each of the bias circuits 428, 429, 446, 466 may be connected to external voltage sources, which are configured to provide the desired bias voltages.

According to an embodiment, within package 430, input-side wirebond arrays 434, 454 between the carrier and peaking input leads 433, 453 and the inputs (e.g., gate terminals) of the carrier and peaking amplifiers 436, 456 form inductive portions of carrier and peaking input matching networks (e.g., IMNs 134, 154, FIG. 1). The input matching networks may include other components (e.g., shunt capacitors, and so on), as well. Similarly, output-side wirebond arrays 441, 461 within package 430 between the outputs (e.g., drain terminals) of the carrier and peaking amplifiers 436, 456 and the carrier and peaking output leads 447, 467 form inductive portions of carrier and peaking output circuits 440, 460 (e.g., output circuits 140, 160, FIG. 1) and/or output matching networks (e.g., OMNs 240, 260, FIG. 2). According to one embodiment, wirebonds 441 and carrier output lead 447 correspond to an inductance (e.g., inductor 141, FIG. 1) in the carrier output circuit 440. Similarly, wirebonds 461 and peaking output lead 467 correspond to an inductance (e.g., inductor 161, FIG. 1) in the peaking output circuit 460. The series inductance value of each of wirebond array 441 plus carrier output lead 447, and the series inductance value of wirebond array 461 and peaking output lead 467 may be in a range of about 0.1 nanohenry (nH) to about 1.0 nH, although the series inductances may be smaller or larger, as well.

Along with the inductance provided by wirebonds 441 and carrier output lead 447, the carrier output circuit 440 also includes an impedance transformation element 442 (e.g., impedance transformation element 142, FIG. 1) and a capacitor 443 (e.g., capacitor 143, FIG. 1) coupled in series between the output (e.g., drain terminal) of carrier amplifier 436 and a combining node 470 (e.g., combining node 170, FIG. 1). According to an embodiment, the impedance transformation element 442 consists of single-section transmission line element (e.g., with a substantially rectangular shape, as illustrated) that is coupled to the top surface of the substrate 401. The transmission line element may be formed, for example, from a portion of the patterned conductive layer on the top surface of the substrate 401, and the transmission line element has a proximal end (e.g., the left edge to which output lead 447 is connected) and a distal end (e.g., the right edge to which capacitor 443 is connected).

The capacitor 443 may be a discrete capacitor, for example, with a first terminal connected to the distal end of element 442, and with a second terminal connected to the combining node 470. The capacitance value of capacitor 443 may be in a range of about 0.1 pF to about 200 pF, although the capacitance value may be smaller or larger, as well.

According to an embodiment, the carrier output circuit 440 also includes a shunt passive component 445 (e.g., shunt component 145, FIG. 1) electrically connected to a node between carrier output lead 447 and impedance transformation element 442. Although the shunt passive component 445 may form a portion of a distinct circuit, in the embodiment illustrated in FIG. 4, the shunt passive component 445 is provided by a portion of the carrier drain bias circuit 446. More specifically, the shunt passive component 445 is provided by a portion of a feed line of the bias circuit 446 (e.g., a drain feed) that extends between impedance transformation element 442 and a feed line shunt capacitor 444. As shown in FIG. 4, the feed line shunt capacitor 444 is electrically connected between the feed line and a ground node 408 of the amplifier 400. The electrical length of the feed line (specifically the electrical length of the line between impedance transformation element 442 and capacitor 444) determines whether the shunt passive component 445 emulates a shunt inductance or a shunt capacitance. Because capacitor 444 can be placed anywhere along the feed line, the electrical length of the feed line can be altered to emulate a shunt inductance or a shunt capacitance having a desired inductance or capacitance value, according to an embodiment. More specifically, when the capacitor 444 is positioned so that the electrical length of the feed line between the impedance transformation element 442 and capacitor 444 is less than 90 degrees at the center operational frequency of amplifier 400, the shunt passive component 445 emulates a shunt inductance (e.g., having an inductance value in a range of about 1.0 nH to about 5.0 nH). Conversely, when the capacitor 444 is positioned so that the electrical length of the feed line between the impedance transformation element 442 and capacitor 444 is greater than 90 degrees at the center operational frequency of amplifier 400, the shunt passive component 445 emulates a shunt capacitance (e.g., having a capacitance value in a range of about 0.1 pF to about 10 pF).

According to an embodiment, an electrical length of the carrier output circuit 440 (e.g., electrical length 144) equals about $\theta_x$. As indicated previously, the electrical length of the carrier output circuit is defined by the parasitic output capacitance (e.g., drain-source capacitance 139, FIG. 1) of the final-stage transistor of the carrier amplifier 436, the series inductance of wirebonds 441 and carrier output lead 447, the phase shift imparted between the proximal and distal ends of impedance transformation element 442, the capacitance of capacitor 443, and the shunt inductance or capacitance of shunt passive component 445. The output circuitry also functions as an output matching network (OMN) (e.g., OMN 240, FIG. 2) between the carrier amplifier 436 and the combining node 470. As indicated in FIGS. 1 and 2, various modifications could be made to the components of the carrier output circuit 440 (and by extension to the carrier OMN), including adding an additional shunt capacitor (e.g., shunt capacitor 148, FIG. 1), and/or implementing any of a variety of T-networks, pi-networks, or hybrid T-/pi-networks, as discussed in conjunction with FIG. 2.

As mentioned above, the peaking output circuit 460 includes an inductance provided by wirebonds 461 and peaking output lead 467. The peaking output circuit 460 also includes an impedance transformation element 462 (e.g., impedance transformation element 162, FIG. 1) and a capacitor 463 (e.g., capacitor 163, FIG. 1) coupled in series between the output (e.g., drain terminal) of peaking amplifier 456 and a combining node 470 (e.g., combining node 170, FIG. 1). According to an embodiment, the impedance transformation element 462 consists of single-section transmission line element (e.g., with an elongated and curved shape, as illustrated) that is coupled to the top surface of the substrate 401. The transmission line element 462 may be formed, for example, from a portion of the patterned conductive layer on the top surface of the substrate 401, and the transmission line element 462 has a proximal end (e.g., the left edge to which output lead 467 is connected) and a distal end (e.g., the horizontal edge to which capacitor 463 is connected).

The capacitor 463 may be a discrete capacitor, for example, with a first terminal connected to the distal end of element 462, and with a second terminal connected to the combining node 470. The capacitance value of capacitor 463 may be in a range of about 0.1 pF to about 200 pF, although the capacitance value may be smaller or larger, as well. In some embodiments, a reactance of capacitor 463 is equal and opposite to a value of the reactive portion of the complex impedance, $Z_L$.

According to an embodiment, the peaking output circuit 460 also includes a shunt passive component 465 (e.g., shunt component 165, FIG. 1) electrically connected to a node between peaking output lead 467 and impedance transformation element 462. Although the shunt passive component 465 may form a portion of a distinct circuit, in the embodiment illustrated in FIG. 4, the shunt passive component 465 is provided by a portion of the peaking drain bias circuit 466. More specifically, the shunt passive component 465 is provided by a portion of a feed line of the bias circuit 466 (e.g., a drain feed) that extends between impedance transformation element 462 and a feed line shunt capacitor 464. As shown in FIG. 4, the feed line shunt capacitor 464 is electrically connected between the feed line and a ground node 409 of the amplifier 400. The electrical length of the feed line (specifically the electrical length of the line between impedance transformation element 462 and capacitor 464) determines whether the shunt passive component 465 emulates a shunt inductance or a shunt capacitance. Because capacitor 464 can be placed anywhere along the feed line, the electrical length of the feed line can be altered to emulate a shunt inductance or a shunt capacitance having a desired inductance or capacitance value, according to an embodiment. More specifically, when the capacitor 464 is positioned so that the electrical length of the feed line between the impedance transformation element 462 and capacitor 464 is less than 90 degrees at the center operational frequency of amplifier 400, the shunt passive component 465 emulates a shunt inductance (e.g., having an inductance value in a range of about 1.0 nH to about 5.0 nH). Conversely, when the capacitor 464 is positioned so that the electrical length of the feed line between the impedance transformation element 462 and capacitor 464 is greater than 90 degrees at the center operational frequency of amplifier 400, the shunt passive component 465 emulates a shunt capacitance (e.g., having a capacitance value in a range of about 1.0 pF to about 10 pF).

In some embodiments, both of shunt passive components 445, 465 are configured as capacitive elements, and in other embodiments, both of shunt passive components 445, 465 are configured as inductive elements. In still other embodiments, shunt passive component 445 may be configured as a capacitive element, and shunt passive component 465 may be configured as an inductive element, or vice versa.

As discussed above, according to various embodiments, an electrical length of the peaking output circuit 460 (e.g., electrical length 164) may equal about 0 degrees or about n*180 degrees. As indicated previously, the electrical length of the peaking output circuit 160 is defined by the parasitic output capacitance (e.g., drain-source capacitance 159, FIG. 1) of the final-stage transistor of the peaking amplifier 456, the series inductance of wirebonds 461 and peaking output lead 467, the phase shift imparted between the proximal and distal ends of impedance transformation element 462, the capacitance of capacitor 463, and the shunt inductance or capacitance of shunt passive component 465. The output circuitry also functions as an output matching network (OMN) (e.g., OMN 260, FIG. 2) between the peaking amplifier 456 and the combining node 470. As indicated in FIGS. 1 and 2, various modifications could be made to the components of the peaking output circuit 460 (and by extension to the peaking OMN), including adding an additional shunt capacitor (e.g., shunt capacitor 168, FIG. 1), and/or implementing any of a variety of T-networks, pi-networks, or hybrid T-/pi-networks, as discussed in conjunction with FIG. 2.

The CCL matching circuit 480 (e.g., CCL matching circuit 180, FIG. 1), which will now be described in more detail, is shown enlarged on the right side of FIG. 4. As with the impedance transformation elements 442, 462, the CCL matching circuit 480 may be a complex transmission line that includes, for example, a portion of the patterned conductive layer on the top surface of the substrate 401. The CCL matching circuit 480 has a proximal end 486 and a distal end 487. Non-conductive gaps are present in the patterned conductive layer on the top surface of the substrate 401 between the impedance transformation elements 442, 462 and the CCL matching circuit 480, and the proximal end 486 of the CCL matching circuit 480 is electrically connected to the distal ends of the impedance transformation elements 442, 462 through capacitors 443, 463. According to an embodiment, the combining node 470 (e.g., combining node 170, FIG. 1) is located at and forms a portion of the proximal end 486 of the CCL matching circuit 480. The second terminals of capacitors 443, 463 are connected to the proximal end 486, and thus are connected to combining node 470.

As discussed previously, and according to an embodiment, the CCL matching circuit 480 presents or provides a complex impedance, $Z_L$, to the combining node 470 that can be represented as: $Z_L=R_L(1+/-j\ x_n)$. A variety of configurations for CCL matching circuit 480 may be implemented that are suitable to achieve the desired complex impedance, $Z_L$. In various embodiments, for example, the CCL matching circuit 480 may be realized using lumped elements, distributed elements, or as a hybrid circuit that includes both distributed and lumped elements. According to one non-limiting example embodiment, the CCL matching circuit 480 is a simple two-section transmission line matching network in which widths and lengths of the sections are optimized for any given application. More specifically, the CCL matching circuit 480 includes or consists of first and second transmission line segments 481, 482 (e.g., microstrip transmission lines) connected in series between the proximal and distal ends 486, 487 of the CCL matching circuit 480. The first transmission line segment 481 has a first width 484 and a first length 485, where the first length 485 corresponds to a dimension that extends from the proximal end 486 of the CCL matching circuit 480 to a junction 483 between the first and second transmission line segments 481, 482. The second transmission line segment 482 has a second width 488 and a second length 489, where the second length 489 corresponds to a dimension that extends from the junction 483 between the first and second transmission line segments 481, 482 and the distal end 487 of the CCL matching circuit 480. In operation, for positive values of $x_n$, the combined electrical length of the first and second transmission line segments 481, 482 is less than 90 degrees. In such cases, the first (narrower) transmission line segment 481 essentially functions as a series inductance, and the second (wider) transmission line segment 482 essentially functions as a shunt capacitance, so that the CCL matching circuit 480 emulates a two-section matching circuit (e.g., a low-pass filter that functions to transform $Z_L$ to 50 ohms). Conversely, for negative values of $x_n$, the combined electrical length of the first and second transmission line segments 481, 482 is greater than 90 degrees. In such cases, the first (narrower) transmission line segment 481 essentially functions as a shunt capacitance, and the second (wider) transmission line segment 482 essentially functions as a series inductance.

According to an embodiment, the first and second widths 484, 488 are significantly different from each other, and this characteristic together with fact that total electrical length of the CCL matching circuit 480 is not equal to 90 degrees results in the non-zero value, $x_n$, of the reactive portion of the complex impedance, $Z_L$, presented by the CCL matching circuit 480. For example, the second width 488 may be in a range of about 20 percent to 400 percent greater than the first width 484, in an embodiment. According to some embodiments, the first width 484 may be in a range of about 10 mils to about 100 mils, and the second width 488 may be in a range of about 100 mils to about 700 mils, although the first and/or second widths 484, 488 may be narrower or wider, as well.

The first and second lengths 485, 489 may be substantially equal to each other, in some embodiments, or the first and second lengths 485, 489 may be significantly different from each other, in other embodiments. According to some embodiments, the first length 485 may be in a range of about 100 mils to about 400 mils, and the second length 489 may be in a range of about 400 mils to about 1000 mils, although the first and/or second lengths 485, 489 may be shorter or longer, as well. An electrical length of the first transmission line segment 481 is in a range of about 20 degrees to about 60 degrees, and an electrical length of the second transmission line segment 482 is in a range of about 40 degrees to about 120 degrees, in an embodiment.

In an embodiment, the first width 484 of the first transmission line segment 481 is significantly smaller than the first length 485 of the first transmission line segment 481 (i.e., the first length 485 is significantly larger than the first width 484). For example, in some embodiments, the first length 485 is at least twice the first width 484 (e.g., from two to 20 times the first width 484. In a further embodiment, the second width 488 of the second transmission line segment 482 is significantly smaller than the second length 489 of the second transmission line segment 482 (i.e., the second length 489 is significantly larger than the second width 488). For example, in some embodiments, the second length 489 is at least twice the second width 488 (e.g., from two to 20 times the second width 488). Said another way, the longest dimensions (i.e., the lengths 485, 489) of the first and second transmission line segments extend parallel to each other and parallel to a line between the proximal and distal ends 486, 487 of the CCL matching circuit 480.

The distal end 487 of the CCL matching circuit 480 (i.e., the right end of the second transmission line segment 482) is connected to RF output 490 (e.g., RF output 190, FIG. 1). According to an embodiment, RF output 490 includes a 50 ohm transmission line 491 and an RF output connector 492. The distal end 487 of the CCL matching circuit 480 is connected to a proximal end (i.e., the left end, in FIG. 4) of the 50 ohm transmission line 491, and a distal end (i.e., the right end, in FIG. 4) of the 50 ohm transmission line 491 is coupled to the RF output connector 492. As with the CCL matching circuit 480, the 50 ohm transmission line 491 may include, for example, a portion of the patterned conductive layer on the top surface of the substrate 401.

The above-described embodiments include practical, compact, cost-effective, mass-producible implementations of a high power Doherty amplifier architectures, which may utilize two asymmetric or highly-asymmetric carrier and peaking devices together with a complex combining load matching circuit. When compared with conventional asymmetric Doherty power amplifiers, the above-described Doherty amplifier embodiments may provide an increased power added efficiency, especially at higher output power back-off levels.

An embodiment of a Doherty power amplifier includes a carrier amplification path that includes a carrier amplifier with a carrier amplifier input and a carrier amplifier output, and a peaking amplification path that includes a peaking amplifier with a peaking amplifier input and a peaking amplifier output, wherein a peaking-to-carrier size ratio, a is greater than 1.15 (e.g., greater than or equal to 2.0). The Doherty power amplifier also includes input circuitry configured to provide a carrier input signal to the carrier amplifier input and to provide a peaking input signal to the peaking amplifier input, where the input circuitry is configured to produce the carrier and peaking input signals with an absolute value of an input phase offset in a first range from 15 degrees to 165 degrees or in a second range from 195 degrees to 345 degrees. The Doherty power amplifier also includes a combining node configured to combine a carrier output signal produced by the carrier amplification path with a peaking output signal produced by the peaking amplification path, and a complex combining load matching circuit connected between the combining node and an output of the Doherty amplifier. The complex combining load matching circuit is configured to provide a complex impedance to the combining node with an absolute normalized value of a reactive portion, $x_n$, that is greater than zero. A peaking output circuit is connected between the peaking amplifier output and the combining node, and an electrical length of the peaking output circuit is equal to 0 degrees or n*180 degrees (n=an integer value). A carrier output circuit is connected between the carrier amplifier output and the combining node, and a difference between an electrical length of the peaking output circuit and an electrical length of the carrier output circuit, $\theta x$, is equal to the input phase offset.

According to a further embodiment, the complex impedance, $Z_L$, provided by the complex combining load matching circuit is:

$$Z_L = R_L(1+/-x_n),$$

where $R_L$ is a load resistance value, $x_n$ is the value of the reactive portion of the complex impedance, and $x_n$ has an absolute value in a range of 0.1 to 5.3.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty power amplifier comprising:
a carrier amplification path that includes a carrier amplifier with a carrier amplifier input and a carrier amplifier output;
a peaking amplification path that includes a peaking amplifier with a peaking amplifier input and a peaking amplifier output, wherein a peaking-to-carrier size ratio, a is greater than 1.15;
input circuitry configured to provide a carrier input signal to the carrier amplifier input and to provide a peaking input signal to the peaking amplifier input, wherein the input circuitry is configured to produce the carrier and peaking input signals with an input phase offset in a first range from 15 degrees to 165 degrees or in a second range from 195 degrees to 345 degrees;
a combining node configured to combine a carrier output signal produced by the carrier amplification path with a peaking output signal produced by the peaking amplification path;
a complex combining load matching circuit connected between the combining node and an output of the Doherty amplifier, wherein the complex combining load matching circuit is configured to provide a complex impedance to the combining node with an absolute normalized value of a reactive portion, $x_n$, that is greater than zero;

a peaking output circuit connected between the peaking amplifier output and the combining node, wherein an electrical length of the peaking output circuit is equal to 0 degrees or n*180 degrees, where n=an integer value; and a carrier output circuit connected between the carrier amplifier output and the combining node, wherein a difference between an electrical length of the peaking output circuit and an electrical length of the carrier output circuit, θx, is equal to the input phase offset.

2. The Doherty power amplifier of claim 1, wherein the peaking-to-carrier size ratio, α is 2.0 or greater.

3. The Doherty power amplifier of claim 1, wherein the complex impedance, $Z_L$, provided by the complex combining load matching circuit is:

$$Z_L = R_L(1 +/- jx_n),$$

where $R_L$ is a load resistance value, $x_n$ is the normalized value of the reactive portion of the complex impedance, and $x_n$ has an absolute value in a range of 0.1 to 5.3.

4. The Doherty power amplifier of claim 3, wherein the input phase offset, $\theta_s$, is derived from the normalized value of the reactive portion of the complex impedance, $x_n$, as follows:

$$\theta_s = \tan^{-1}\left[\frac{(1+\alpha)\beta - 1}{\alpha\beta x_n}\right] + k\pi$$

where β is a load modulation range.

5. The Doherty power amplifier of claim 4, wherein:
in a low power condition, the peaking output circuit presents an open circuit to the combining node, and the carrier output circuit transforms Zmod'=$Z_L$ to Rmod=$\beta R_0$; and
in a saturation condition, the peaking output circuit transforms Zpeak'=$Z_L(1+\alpha)/\alpha$ to Rpeak=$R_0/\alpha$, and the carrier output circuit transforms Zopt'=$Z_L(1+\alpha)$ to Ropt=$R_0$.

6. The Doherty power amplifier of claim 3, wherein:
ABCD parameters for a carrier output matching network of the carrier output circuit, $a_c$, $b_c$, $c_c$, and $d_c$, are given by:

$$a_c = -R_0(\beta - (1+\alpha))\frac{c_c}{\alpha x_n}$$

$$b_c = R_0 R_L(1+\alpha)(\beta - 1)\frac{c_c}{\alpha}$$

$$c_c = \pm\sqrt{\frac{(1+\alpha)\beta - 1}{R_0 R_L(1+\alpha)(\beta-1)(\beta+1)}}$$

$$d_c = R_L(1+\alpha)\left[\frac{\beta - 1}{(1+\alpha)\beta - 1}\right]c_c x_n;$$

and ABCD parameters for a peaking output matching network of the peaking output circuit, $a_p$, $b_p$, $c_p$, and $d_p$, are given by:

$$a_p = \pm\sqrt{\frac{R_0}{R_L(1+\alpha)}}$$

$$b_p = \mp\sqrt{R_0 R_L(1+\alpha)} * \frac{x_n}{\alpha}$$

$$c_p = 0$$

$$d_p = \pm\sqrt{\frac{R_L(1+\alpha)}{R_0}}.$$

7. The Doherty power amplifier of claim 6, wherein:
terms $a_p$ and $d_p$ may be either positive or negative, and the terms $a_p$ and $d_p$ always have a same sign, wherein positive signed terms $a_p$ and $d_p$ give rise to a peaking output matching network insertion phase of 0 degrees or n*180 degrees where n=an even integer, and negative signed terms $a_p$ and $d_p$ give rise to a peaking output matching network insertion phase of n*180 degrees where n=an odd integer;
term $b_p$ has an opposite sign to $a_p$ and $d_p$ for positive values of $x_n$, and has a same sign as $a_p$ and $d_p$ for negative values of $x_n$; and
term $c_m$ may have either a positive sign or a negative sign.

8. The Doherty power amplifier of claim 1, wherein the output of the Doherty amplifier includes a 50 ohm transmission line and an RF connector.

9. The Doherty power amplifier of claim 1, wherein the carrier output circuit comprises:
a first inductance, a first single-section transmission line element, and a first capacitor coupled in series between the carrier amplifier output and the combining node.

10. The Doherty power amplifier of claim 9, wherein the carrier output circuit further comprises a shunt capacitance.

11. The Doherty power amplifier of claim 9, further comprising:
a bias circuit coupled to the carrier amplifier output, wherein the bias circuit includes a bias feed line, wherein when an electrical length of the bias feed line is less than ninety degrees, the bias feed line provides a shunt inductance, and when the electrical length of the bias feed line is greater than ninety degrees, the bias feed line provides a shunt capacitance.

12. The Doherty power amplifier of claim 9, wherein the peaking output circuit comprises:
a second inductance, a second single-section transmission line element, and a second capacitor coupled in series between the peaking amplifier output and the combining node.

13. The Doherty power amplifier of claim 12, wherein the peaking output circuit further comprises a shunt capacitance.

14. The Doherty power amplifier of claim 12, further comprising:
a bias circuit coupled to the peaking amplifier output, wherein the bias circuit includes a bias feed line, wherein when an electrical length of the bias feed line is less than ninety degrees, the bias feed line provides a shunt inductance, and when the electrical length of the bias feed line is greater than ninety degrees, the bias feed line provides a shunt capacitance.

15. The Doherty power amplifier of claim 12, wherein a reactance of the second capacitor is equal and opposite to a value of the reactive portion of the complex impedance.

16. The Doherty power amplifier of claim 1, wherein the complex combining load matching circuit comprises lumped elements, distributed elements, or a combination of both distributed elements and lumped elements.

17. The Doherty power amplifier of claim 1, wherein the complex combining load matching circuit includes multiple transmission line segments coupled between the combining node and the output of the Doherty amplifier, and the multiple transmission line segments comprise:
- a first transmission line segment with a first width connected to the combining node; and
- a second transmission line segment with a second width that is significantly different from the first width connected between the first transmission line segment and the output of the Doherty amplifier.

18. The Doherty power amplifier of claim 1, wherein the input circuitry comprises:
- a power splitter configured to divide the power of an input RF signal into the carrier and peaking input signals; and
- one or more phase delay elements between the power splitter and the carrier amplifier, the peaking amplifier, or both the carrier and peaking amplifier, wherein the one or more phase delay elements are configured to produce the input phase offset between the carrier and peaking input signals.

19. The Doherty power amplifier of claim 1, wherein the input phase offset is between 15 degrees and 165 degrees, excluding offsets between 86 degrees and 94 degrees, or between 195 degrees and 345 degrees, excluding offsets between 266 degrees and 274 degrees.

* * * * *